United States Patent [19]

Bradbeer

[11] Patent Number: 4,973,837
[45] Date of Patent: Nov. 27, 1990

[54] PROXIMITY DETECTORS WITH DUAL-SPEED TRACKING CIRCUITRY

[75] Inventor: Peter F. Bradbeer, Slough, England
[73] Assignee: Electrosense Limited, England
[21] Appl. No.: 312,805
[22] PCT Filed: Aug. 12, 1987
[86] PCT No.: PCT/GB87/00569
§ 371 Date: Feb. 9, 1989
§ 102(e) Date: Feb. 9, 1989
[87] PCT Pub. No.: WO88/01394
PCT Pub. Date: Feb. 25, 1988

[30] Foreign Application Priority Data
Aug. 13, 1986 [GB] United Kingdom ............... 8619727

[51] Int. Cl.$^5$ .................................................. G01V 9/04
[52] U.S. Cl. .................. 250/221; 250/222.1/214 RC; 340/556
[58] Field of Search ............. 250/214 RC, 221, 222.1, 250/223 R; 340/555, 556, 557

[56] References Cited
U.S. PATENT DOCUMENTS

| | | | |
|---|---|---|---|
| 3,197,656 | 6/1965 | Kintner | 307/88.5 |
| 3,644,917 | 1/1972 | Perlman | 340/258 |
| 4,027,154 | 5/1977 | Flint | 250/222.1 |
| 4,068,222 | 1/1978 | Treviranus | 250/221 |
| 4,075,507 | 2/1978 | Pauli et al. | 250/221 |
| 4,166,948 | 9/1979 | Steffen | 250/222.1 |
| 4,319,332 | 3/1982 | Mehnert | 340/556 |
| 4,479,053 | 10/1984 | Johnston | 250/221 |
| 4,799,044 | 1/1989 | Masters et al. | 250/221 |

FOREIGN PATENT DOCUMENTS

| | | |
|---|---|---|
| 0144882 | 6/1985 | European Pat. Off. . |
| 3344576 | 6/1985 | Fed. Rep. of Germany . |
| 2200969 | 4/1974 | France . |

Primary Examiner—David C. Nelms
Attorney, Agent, or Firm—Nixon & Vanderhye

[57] ABSTRACT

A proximity detector in which a sensor unit (10) senses reflected energy received from a predetermined volume or zone and generates an electrical signal representative of the received energy. Circuit means process the received signals to control the operation of apparatus such as automatic doors. One aspect of the invention is concerned with the sensor unit in which transmitters (14) are located in a housing with a receiver (15). The housing has a filter (7) through which infrared radiation can be transmitted and received. Mask areas on the filter define the zone into which radiation can be transmitted and from which it can be received. The filter is interchangeable so that zones of different sizes and dimensions can be provided. Another aspect is concerned with novel signal processing circuitry and a further aspect is concerned with an ultrasonic system wherein a multiplier is used to process the received signals.

13 Claims, 5 Drawing Sheets

PROXIMITY DETECTORS WITH DUAL-SPEED TRACKING CIRCUITRY

This invention relates to proximity detector arrangements. Particularly, but not exclusively, the invention relates to proximity detectors which are used to control the opening and closing of automatic doors such as those employed at supermarkets or large office buildings.

Automatic door installations are known which include means for ensuring that the doors cannot close on a person standing in the doorway thereby causing discomfort or injury. Some arrangements include means for detecting the presence of a person in the doorway and one common known method makes use of a single magic eye beam projected across the door opening at a height of approximately 1½ feet. When the beam is broken the doors cannot be closed. Other devices commonly make use of capacitive detectors for detecting undulations of the human body in front of the doorway whilst ignoring the relatively flat slam-post of the door frame by balance bridge techniques. Capacitive detectors are usually operated in bridge networks but have a number of problems. For example, the framework of the doorway and the edge of the door frame need to be parallel in order to maintain a balanced bridge condition. Secondly capacitive detectors are affected by moisture and humidity and temperature changes. Thirdly wear on the door installation may cause vibration and jitter which can again lead to false detection due to imbalance of the bridge.

These types of detectors are used only as safety devices for preventing unwanted closing of the doors but they are not capable of functioning as general door operating devices. Door operating devices are known which employ microwave type sensors and also passive infra-red type sensors. These operate by detecting movement of a body within a zone close to the door. When the sensor senses movement within that zone the doors are opened. The passive infra-red devices operate by sensing undulations in the amount of heat from a body reflected to a infra-red sensor which occurs as the person traverses the detection zone. The microwave type devices employ transmitters and receivers and operate on the Doppler principle where the reflected frequency and the transmitted frequency are summed, the difference between the two usually being in the audio frequency range. This undulation is detected and the rate of undulation is proportional to the speed of movement of the person in the detection zone.

Passive infra-red devices have a number of problems particularly when used in conjunction with automatic doors. Since they are heat detecting devices they are susceptible to gusts of wind, thermals, heat curtains etc. They can also be adversely effected by incandescent lamp radiation from for example vehicle headlamps or street lighting. Also other thermal changes can lead to false detection problems.

Microwave devices operate reasonably well as door actuators but suffer from safety defects The main problem with microwave devices is that the zone into which the microwave energy is transmitted has to be projected slightly away from the moving doors since otherwise the receivers tend to detect radiation from the doors themselves. Thus as the doors are closing they can cause a reflection of microwave energy leading to re-opening of the doors and hence an oscillatory motion of the doors. Another problem with microwave devices is their sensitivity to rainwater, moving folliage and other moving objects such as pieces of paper. Furthermore microwave proximity detectors can be triggered by radiation from transmitters such as taxi radios, fluorescent lighting and other similar devices. Also because the beam has to be projected slightly away from the doors which the proximity detector is controlling there is a dead space or zone immediately in front of the doorway and this can cause problems with slow moving persons e.g. invalids moving with a walking frame. When such a person moves into the detection zone they are sensed and the doors will open. If they stop the doors will then close but be re-opened when further movement is sensed. Immediately in front of the door however, they may be out of the zone of microwave radiation and hence in a position where they cannot be sensed whether they are stationary or not. If they remain stationary for any length of time in such a zone the door can close on them and result in an accident.

The present invention is concerned with a proximity detector arrangement which is particularly suitable for controlling operation of automatic doors and in which such disadvantages are alleviated.

The invention is concerned in general with a proximity detector which comprises a sensor unit arranged to sense reflected energy received from a predetermined volume or zone and to generate a signal representative of the received energy and circuit means for processing said received signals to control the operation of apparatus such as automatic doors.

One aspect of the invention comprises a sensor unit having one or more transmitters for transmitting radiation of optical or near optical wavelengths into a predetermined volume or zone, one or more receivers responsive to radiation of the transmitted wavelength, and means for selectively defining the volume or zone into which the energy is transmitted. The defining means may comprise a filter having masked areas for defining radiation transmitting zone. The filter may also be used to define the zone from which radiation can be received. The filter may form part of a housing which accommodates the transmitter and receivers and may be interchangeable. The use of transmitters of near optical wavelengths enables the radiation to be transmitted into a zone one edge of which is extremely close to the doors thereby effectively avoiding the production of a dead area close to the doors. Preferably the radiation has wavelengths in the infra-red range.

Another aspect of the invention concerns control circuit means for processing the received signals to control actuation of the apparatus. The control circuit includes means for generating a signal representative of the signal received by said sensor unit, means for sensing when the received signal changes, and means for controlling operation of the apparatus in response to a sensed change.

The sensing means may include a comparator for comparing the representative signal with a voltage signal, said comparator being arranged to change state when the representative signal varies from said voltage signal, and circuit means associated with said comparator for causing said voltage signal to follow or track changes in the representative signal in a predefined way.

The circuit means may include a capacitor having associated charging and discharging circuitry for charging or discharging the capacitor according to the direction of the change of the representative signal and so as to cause the voltage signal to undergo said tracking.

The charging and discharging circuits may have time constants selected to provide appropriate time delays in the operational sequence of the apparatus.

The control circuit means may include switching means for inhibiting operation of the charging or discharging circuitry for a given period of time after the sensing of a door opening condition.

A further aspect of the invention provides sensing apparatus of the type comprising a transmitter for transmitting radiation into a zone receiver for sensing radiation received from that zone, and circuit means responsive to the receiver signal for generating an output signal, said circuit means including means for multiplying the receiver output, or a signal derived from that output, with a reference signal. The reference signal is preferably the carrier signal applied to said transmitter or a signal derived from that carrier. The multiplied signal may be applied to a low pass filter to produce a DC level indicative the received signal.

The multiplication can be carried out using a correlator, a synchronised rectifier or a phase matching circuit.

It has been found that subjecting the received signal to a multiplication or correlation step enable the sensing apparatus to operate with a relatively low power transmitter. The technique is applicable to sensing apparatus which may use a wide range of wavelengths, e.g. ultrasonics, optical, microwave.

The invention will be described now by way of example only with particular reference to the accompanying drawings. In the drawings.

Figure 3:
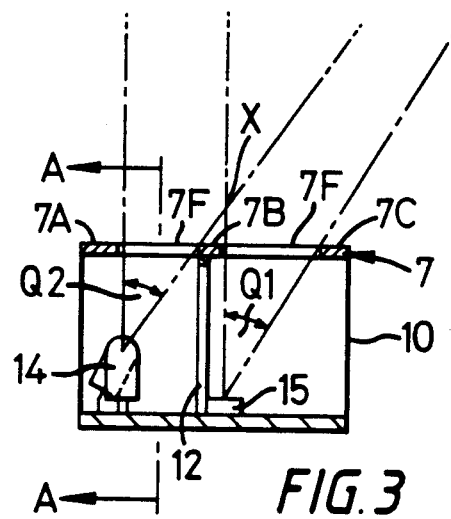
FIG. 3 is an end sectional view of the sensor unit.
Figure 4:
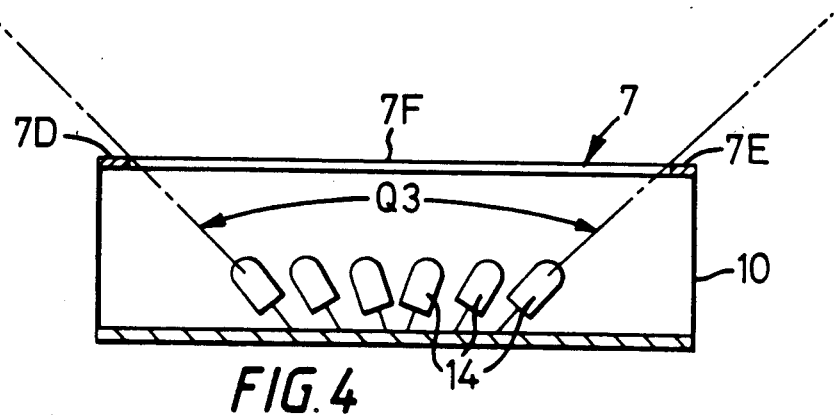
FIG. 4 is a section on the line A—A of FIG. 3.

A proximity detector includes a sensing unit which comprises a box shaped housing 10 of rectangular cross-section. The housing 10 is divided into two substantially equal volumes by a longitudinally extending opaque barrier 12. On one side of the barrier 12 the housing 10 accommodates a plurality of longitudinally spaced infra-red transmitters 14. On the other side of the barrier the housing accommodates an infra-red receiver 15. The housing can be closed by a removable filter 7. The filter 7 has printed thereon mask areas which are opaque to infra red energy and are shown by reference numerals 7A, 7B, 7C, 7D and 7E. Such masks define areas 7F through which infra-red radiation can pass. That is to say the filter defines the volume or zone into which infra-red radiation can be transmitted and also from which infra-red radiation can be received by the receiver 15. As can be seen in FIGS. 3 and 4 the transmitters 14 are so arranged and orientated that infra-red radiation can be transmitted into the entire solid angle defined by the mask areas 7A to 7E. The infra-red radiation typically has a wavelength of 940 nm.

Figure 1:
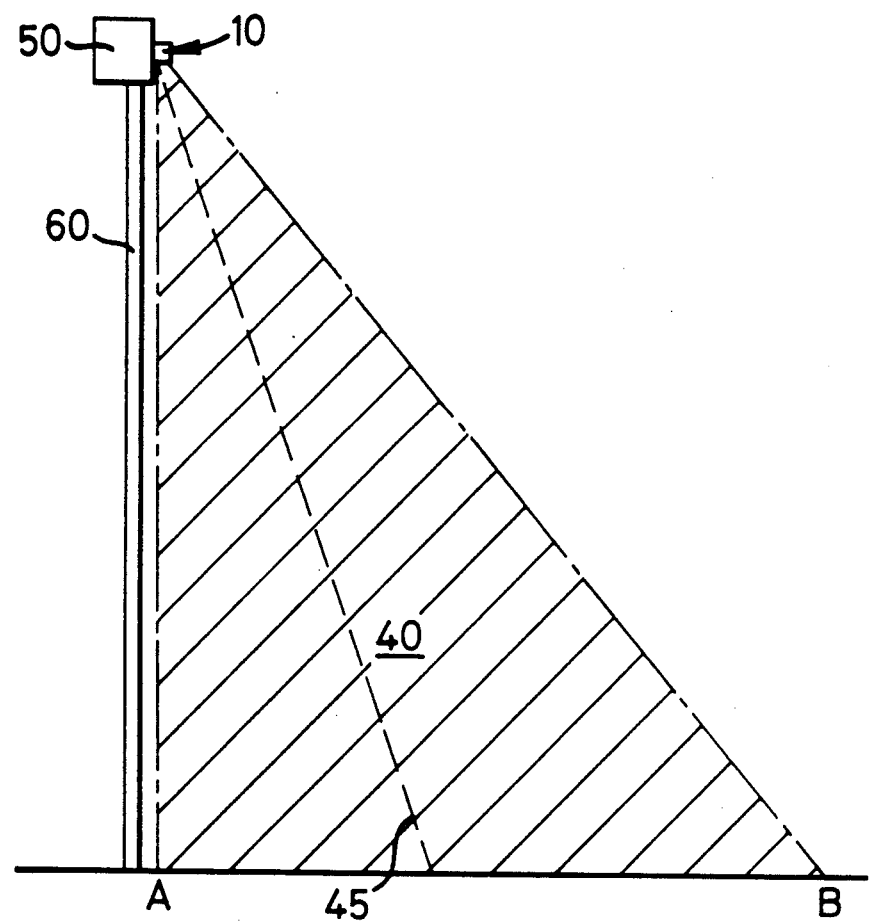
FIG. 1 is a side elevation showing the mounting of a sensor unit of a proximity detector on a door frame.
Figure 2:
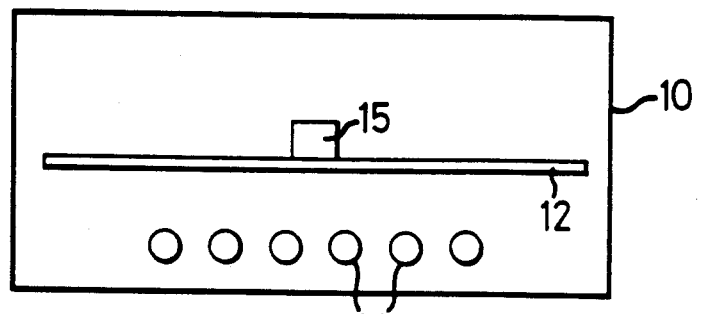
FIG. 2 is a plan view of the sensor unit.

The intersection of the transmitted and received beams shown at X in FIG. 3 should be exterior to the housing 10. The position of the intersection is dependent upon the width of the mask area 7B. (y varying the width of area 7B the closest range at which detection occurs can be controlled. This can be useful in preventing false signals from, for example, smoke close to the unit, or dust on the filter. FIG. 1 shows how the sensing unit 10 is mounted in an operational situation. The sensor 10 is securely attached to a transom 50 of a door frame so that it can be used to control the operation of, for example a sliding door 60 which is suspended from the transom. As is clearly shown in FIG. 1 the zone into which the infra-red radiation can be projected from the sensor 10 extends from a point B some distance from the door to a point A extremely close to the door. This means that there is effectively no dead space in front of the door into which a person can move and not be detected. Because of the nature of the radiation transmitted from the transmitters 14 it will not result in reflected signals due to movement of the door and therefore not be susceptible to false signals. It will be appreciated that the size and shape of the zone into which the radiation is transmitted can be variable simply by varying the shape and disposition of the mask areas on the filter. This can easily be achieved by providing a plurality of different filters so that an appropriate one can be selected for each particular installation. In general installations will include two sensors 10 appropriately mounted on the transom 50 in order to cover the necessary zone. The sensors are mounted to provide two detection zones, one on each side of the door, and thereby operate with two-way traffic.

For comparison purposes FIG. 1 also shows by means of dotted line 45 the typical boundary of the zone covered by a microwave type sensor. It can be seen that this boundary is some distance from the door and results in a noticeable dead space adjacent the door in which movement of people cannot be detected.

Figure 5:
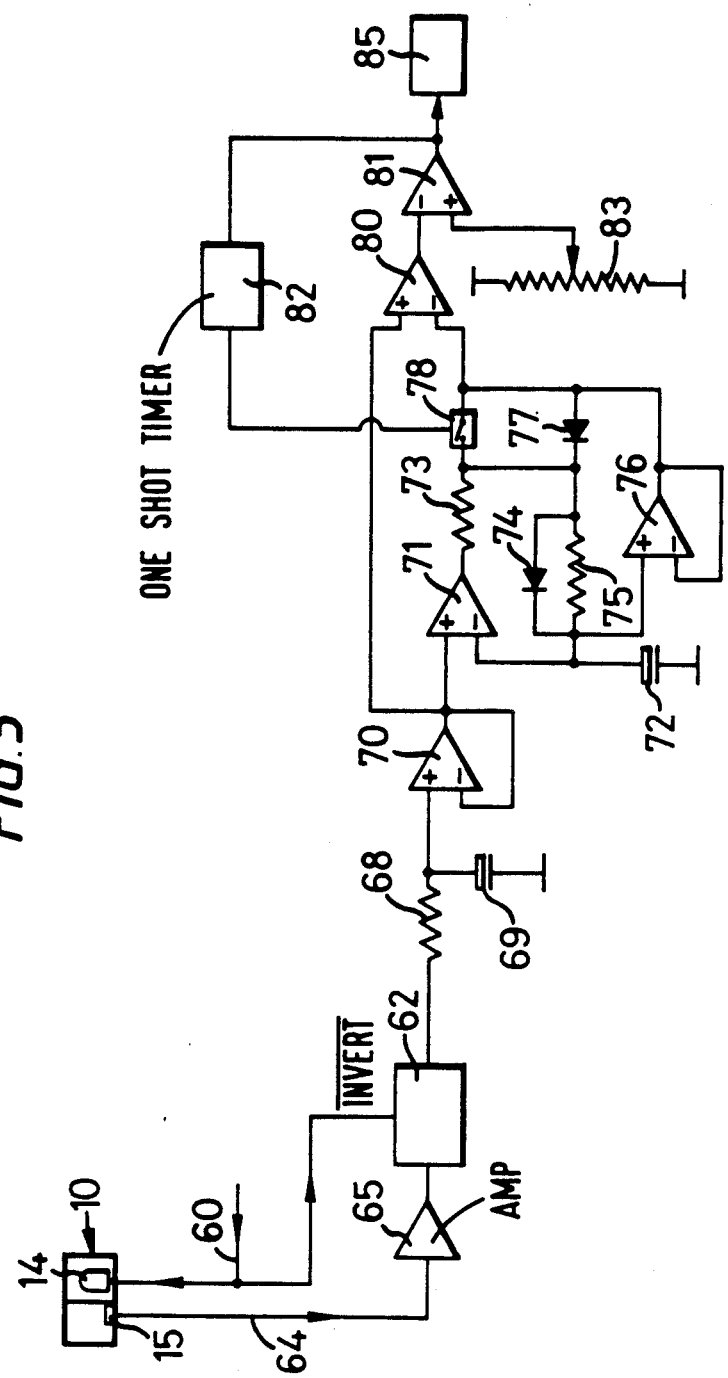
FIG. 5 is a detailed circuit diagram showing the circuitry for processing signals from the sensor.

The sensor 10 is designed to operate with electronic circuitry which controls the energisation of the sensor and performs processing of any received signals. Such circuitry is shown in FIG. 5 of the drawings. The circuitry shown is for use with a single sensor 10 for ease of understanding but an explanation will be given subsequently of the way in which this can be extended to operate with two sensors. Referring to FIG. 5 the sensor is shown at 10 with its transmitters 14 and receivers 15. A carrier signal is fed to the transmitters 14 along line 60 and used to modulate the transmitters. The frequency of this carrier signal is not critical and may be any convenient value suitably selected according to the components used for the remainder of the circuit. This signal is also applied to a synchronous rectifier 62. Any signal sensed by the receiver 15 is fed via line 64 and amplifier 65 to the synchronous rectifier 62. The carrier signal acts as a synchronisation signal for the rectifier 62 and the rectifier has the effect of multiplying the signal from the amplifier 65 first by 1 and then by -1 and so forth. The output of the synchronous rectifier 62 is a synchronously rectified version of the output of the amplifier. This signal is fed to an integrator arrangement which comprises a resistor 68 and a capacitor 69.

The effect of the combination of a synchronous rectifier and low pass filter is to produce a band pass filter, the bandwidth of which has a direct relationship with the cut-off frequency of the low-pass filter.

The integrated signal produced by the low pass filter is fed to a high input impedance amplifier 70, the output of this amplifier being a DC voltage whose level is proportional to the magnitude of the received signal on line 64. The circuit arrangement is such that an increase in the signal level on line 64 causes a drop in the DC level at the output of the amplifier 70 and vice versa.

The output of the amplifier 70 is connected to a comparator 71 which is arranged to compare the DC output from the amplifier 70 with a DC voltage stored on a capacitor 72. The comparator 71 and capacitor 72 have associated circuit elements comprising resistor 73, diode 74, resistor 75, buffer amplifier 76, diode 77, and switch 78 which are arranged to control the discharge or charge of the capacitor 72 in a manner which will be described. The output from the buffer amplifier 70 is also fed directly to an input of a differential amplifier 80 which also receives as an input the output from the buffer amplifier 76. The output of the differential amplifier 80 is connected to a comparator 81 the other input of which is connected to a potential divider 83. The output from the amplifier 81 is fed via a one shot multivibrator 82 to provide a control signal for the switch 78. The output of the comparator 81 also provides a control signal for operating the doors.

As explained the output of the amplifier 70 is a signal proportional to the size of the received signal. This DC signal is compared by the comparator with the signal on the capacitor 72. When the output of the amplifier 70 changes the circuitry associated with the comparator 71 and capacitor 72 will charge or discharge the capacitor 72 depending upon the result of the comparison. The output of the comparator determines whether charging or discharging is required. The comparator will give a positive output if the capacitor needs to be charged to bring its voltage to a level equal to the level of the output of the amplifier 70 whilst it will provide a negative output if discharging is required in order to bring about equality. The resistor 73 is used to limit current which may be drawn from the output of the comparator 71 and is of the order of a few tens of K Ω. This resistor also controls the rate at which the voltage signal tracks the representative signal when a reduction in received signal occurs. Its impedance is insignificant when compared with the impedance of the resistor 75. To charge the capacitor, charging current is provided via the diode 74 which bypasses the resistor 75 so that the limitation on current in the charging mode is controlled by the resistor 73. Hence the rate of tracking in this direction may be preset to any desired value. In the discharging mode the maximum voltage across the resistor 75 is limited to one diode drop at the diode 77 acting in conjunction with the buffer 76. If the switch 78 is closed no current can flow either in or out of capacitor 72 and this effectively constitutes a hold command.

The circuit items 71 to 77 in conjunction with the switch 78 in its open circuit position operate to produce an output at the output of the buffer 76 which tracks the output of the buffer 70 in a controlled manner. If for example the DC output level from the buffer 70 rises (i.e. the reflected signal on line 64 is reducing) then the output voltage at the buffer 76 rapidly follows that signal and tracks the voltage at the output of the buffer 70. However should the DC level at the output of the buffer 70 drop then the output from the buffer 76 falls very slowly due to the slow discharge of the capacitor 72. It eventually equalises with the output of the buffer 70, but after some considerable delay. The effect of closing the switch 78 during either of these situations is to effectively halt the compensatitive effect of the circuit elements.

To describe this operation in more detail consider the output from the buffer 70 rising to some new value. The output of the comparator 71 immediately swings fully positive so that a charging current is fed to the capacitor 72 via the resistor 73 and the diode 74, this group of elements having a small time constant. This assumes that the switch 78 is in its open circuit condition which it will normally will be. The charging current causes the voltage of the capacitor 72 to rise rapidly until it reaches a value equal to that to which the output of the buffer 70 rose. Ar this point the output of the comparator 71 effectively hunts between a positive and a negative state in such a manner that the voltage of the capacitor 72 remains in equality with the output of the buffer 70.

Conversely when the DC output level at the buffer 70 falls to some new value, the comparator 71 switches to a fully negative state. In this condition the diode 77 conducts thereby limiting the voltage across the resistor 75 to one diode drop. This produces a very small discharge current from the capacitor 72. Thus the voltage at the capacitor 72 falls in a substantially linear manner with a very long time constant until equality is reached with the voltage at the output of the buffer 70. At this point the comparator output again hunts between a positive and negative potential thereby keeping the voltage of the capacitor 72 in equality with the output of the buffer. It should be noted that the value of resistor 75 is some several tens of times greater than that of resistor 73.

Thus it will be seen that the comparator 71 is effectively a direction indicator whose output indicates the direction of change of the output from the buffer 70. The components 72,73,74,75,76,77 produce a voltage signal which tracks or follows the buffer output. The tracking rate depends on the direction of change. In one direction the tracking rate is very rapid whilst in the other it is at a slower fixed rate which is determined by the values of the components just referred to.

The amplifier 80 amplifies any difference between the voltage levels at the output of the buffer 70 and the output of the buffer 76. If the voltage at the output of these buffers is equal then the output voltage from the amplifier 80 is zero. The voltage at the non-inverting input of comparator 81 is determined by the potential divider 83 and is set to be a more negative offset voltage than that applied to the inverting input when the voltages from the buffers 70 and 76 are equal. Thus if the output from the differential amplifier 80 moves negatively greater than this offset voltage the comparator 81 switches to a high state. This produces a signal which is fed to a door opening control 85 to cause opening of the doors, and will also trigger the circuit 82.

In order for the output of differential amplifier 80 to fall the level at the output of buffer 70 must be less than that of the output of buffer 76, that is to say the received signal on line 64 has increased and the compensation provided by capacitor 72 and its associated circuit elements has not yet tracked to this new condition. Tracking in this direction is extremely slow so there will be an output from the comparator 81 for some length of time. When eventually equality is reached between the outputs and buffers 70 and 76 the comparator 81 will revert to its low state thereby removing the door opening signal.

Should the reflected signal on line 64 reduce then the output voltage at the buffer 70 will rise and the output voltage from the buffer 76 will also rise almost instantaneously in a similar manner. Any difference existing between these two levels in this condition will cause the output from differential amplifier 80 to rise.

As described earlier if the output of the comparator 81 changes from a low to a high state the one shot timer 82 is triggered. When this circuit is triggered the switch 78 is closed for a predetermined period, say 5 seconds, thereby inhibiting the tracking action provided by the capacitor 72 and its associated circuit elements. This limits the minimum detection time to something greater than 5 seconds. It should be appreciated that control of the switch 78 can be effected by other than a one shot timer 82, e.g. by monitoring the error signal at the output of amplifier 80 and generating an inhibit signal wherever the error signal is greater than a predetermined value . In this way tracking can be inhibited when a person is very close to the doors.

Relating this now to detecting the presence of human beings approaching the door consider a person entering the zone 40 shown in FIG. 1. If a person enters this zone the receiver 15 will generate an output resulting in a drop in the level at the output of the buffer 70. This causes the comparator 81 to switch producing a signal for opening the doors. The doors are thus opened. The actual door opening control circuitry 85 is not shown in detail but will be apparent to those skilled in the art. If the person continues towards the doors then the output at the buffer 70 continues to fall and the door opening signal is maintained until such time as the person moves beyond the detection zone. When the person leaves the zone the capacitor charges rapidly via diode 74 and resistor 73 so that the door opening signal is removed rapidly.

If after entering the zone, but before reaching the doors the person stops for some reason then the signal at output 70 will stop decreasing and after some time the signal generated by capacitor 72 will fall to that value,- the time delay being determined by the capacitor discharge rate, and after that time the doors will close again. The time taken for this reset time to occur can be any selected value but will be of the order of 10 seconds or so. If subsequently the person moves forward slightly an immediate door opening signal is produced at the output of comparator 81. As a person moves forward one step at a time toward point A the time taken for the circuit to re-balance becomes longer. This is because the reflected signal sent back to the receiver 15 increases in a logarithmic manner (determined by the inverse square law relationship between light intensity and distance from the light source) so that there is a greater increase the closer the person is to the sensor 10. This means that when a person is adjacent to the door close to point A, the time taken for the circuit to reset itself after having opened the door can be a suitably long period time, e.g. some minutes, which is determined by component values in the circuit of FIG. 5. In effect the sensor 10 is detecting the presence of the person rather than their movement, so that the present arrangement has the characteristics of both a movement and a time limited presence sensor.

If a person steps out of the zone of radiation the unit stops detecting immediately. The signal at the output of buffer 70 rises and a door closing signal is generated or the door opening signal is removed and the door assumes a default condition of closed.

In practice there will be, most probably, two sensor units 10 mounted above a door or doors one for each side of the door in a two way traffic installation. In such an arrangement the circuit of FIG. 5 is effectively duplicated but a single synchronous rectifier can be used.

It will be appreciated that it is possible to provide a variable charging or discharging rate for the capacitor 72 and thus provide variable tracking rates for the voltage signal. This can be achieved, for example, by switching further resistors in series or parallel with the resistor 75. The switching can be carried out on the basis of the magnitude of the error signal at amplifier 80.

It will be appreciated that there may be a dead space between the doors when they are open. This problem can be overcome by providing the doors with a conventional presence sensing device to prevent closing of the doors in event that a person stands directly between them when they are open e.g. a conventional light barrier sensor.

A feature of the proximity detector described above is the use of the synchronised rectifier. This effectively correlates the received signal with the carrier reference and operates to substantially increase the signal to noise ratio.

Figure 6:
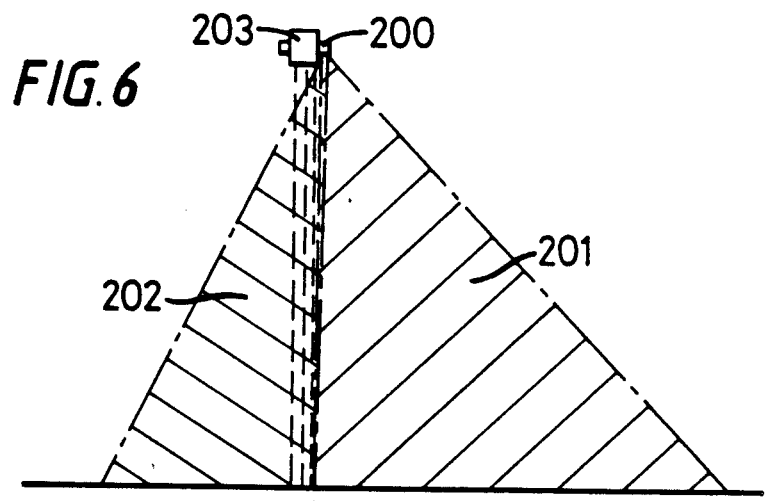
FIG. 6 is a schematic illustration of a modification of the arrangement of FIGS. 1 to 3.

FIG. 6 shows a modification of the arrangement illustrated in FIGS. 1 to 4. In this arrangement a sensor 200 is mounted on a transom 203 above a doorway. The sensor is arranged to project a beam 201 into a detection zone in a similar manner to that described with reference to FIG. 1. This beam is in front of the doorway. In addition the sensor projects a second beam 202 into the doorway, this beam being directed rearwardly from the beam 201. The beam 202 is only activated a given period of time after a door opening cycle has been initiated thereby ensuring that the door is in the fully opened position when the beam is activated so that it can project into the area shown. The beam 202 is connected to appropriate logic circuitry to ensure that the doors do not close prematurely on a person passing through the door.

Figure 7:
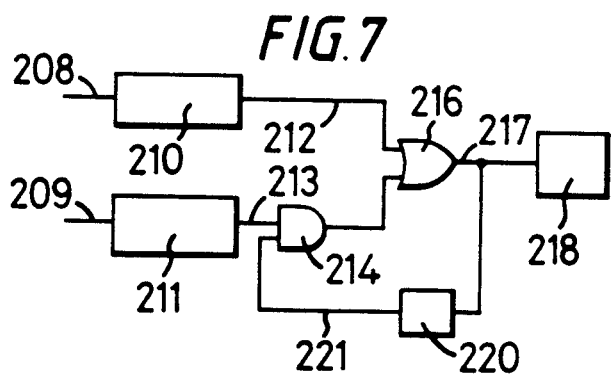
FIG. 7 is a block schematic diagram of logic circuitry for use with the arrangement of FIG. 5.

An example of the logic circuitry which can be used is shown in FIG. 7. The circuit has inputs 208, 209 which receive signals from the sensing elements covering the zones 201 and 202 respectively. Signal processing circuits 210 and 211 process these input signals to give logic outputs 212 and 213. If an object is detected in the zone 201 this is represented by a logical 1 at the output of the circuit 210 on line 212. Similarly detection of an object in the zone 202 results in a logical 1 on line 213.

The line 212 is connected to the input of an OR gate 216 whilst the line 213 is connected to one input of an AND gate 214 the output of which is connected to the second input of the OR gate 216. The output 217 of the OR gate 216 is connected to a control relay or similar output device 218 for controlling the door opening and closing arrangement. The output 217 is also connected to an asymmetric time delay unit 220 which in turn is connected to the second input of the AND gate 214. The operation of the time delay unit 220 is such that if the signal from the output 217 changes from the logical 0 to a logical 1 the output signal on line 221 will change state to a logical 1 after a preset time period has expired. However, a transition from a logical 1 to a logical 0 on the input line 217 results in an immediate transition from a 1 to a 0 on output line 221.

Relating this to the operation of the doors assume that the output relay 218 is de-energized so that the doors are closed. In this condition only detection zone 201 is effective and that at 202 is disabled by virtue of AND gate 214 being closed. A person now enters zone 201 and a signal is fed via the OR gate 216 to energize the relay 218 and thereby cause the doors to open. After a few seconds, depending on the delay setting, the output on line 221 of the time delay unit 220 switches to a logical 1 and this provides a signal to open the AND gate to allow transmission of signals from line 213 to the unit 218. This effectively renders the zone 202 active so that objects present in either zone 201 or 202 will cause the doors to remain open. Should no objects remain in either zone then the output relay 218 is de-energized and in this event the time delay output signal 221 will immediately switch to a logical 0 thus disabling the zone 202.

Figure 8:
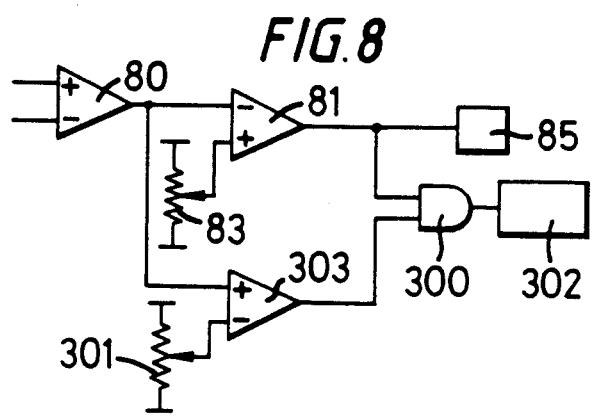
FIG. 8 is a circuit diagram showing a modification of the circuit of FIG. 5, and FIGS. 9 and 10 are block schematic diagrams of circuits for increasing the signal to noise ratio in sensing apparatus.

A further modification of the arrangement described with reference to FIGS. 1 to 5 is shown in FIG. 8. This is a modification to the output stage of the circuit of FIG. 5 and is designed to provide an audible and/or visible warning in the event that the doors are about to close following an opening signal. As shown in FIG. 8 the differential amplifier 80 in addition to being connected to the comparator 81 is connected to a further comparator 303. This comparator 303 has an associated potential divider 301 which is set to provide a voltage level lower than that provided by the voltage divider 83. The logical outputs from the comparators 81 and 303 are fed to the inputs of a two input AND gate 300. The output from this AND gate is connected to an audible and/or visible warning device 302.

In operation when a person enters the detection zone as already described the output of the amplifier 80 falls immediately becoming more negative than the voltage set by the voltage divider 83 thereby causing the output of the comparator 81 to rise to a logical 1. The output of amplifier 81 operates the door opening circuitry in the manner already described. If the voltage at the output of amplifier 80 remains at a level between that of divider 83 and that of divider 201 then both comparators 81 and 303 have outputs which are high; hence under the action of AND gate 300 the warning device 302 is activated. If the voltage crosses the threshold of either comparator 81 or 303 then the warning device will be inhibited.

If the person moves further into the detection zone to cause the output from amplifier 80 to fall to a value which is more negative than the level set by the voltage divider 301 the warning device will again be inhibited. As the capacitor 72 (FIG. 5) tracks linearly towards the representative signal the output from amplifier 80 rises linearly towards zero. As this signal crosses the threshold voltage set by the divider 301 the warning device is activated again until the signal crosses the threshold set by the divider 83 whereupon the door will close and the warning device will again be inhibited. Since the output of amplier 80 rises in a linear manner it can be seen that the period for which the warning device is activated is directly proportional to the voltage differential between the two comparator threshhold. Thus a warning is given for a pre-set period prior to the doors actually closing.

Thus it will be seen that the arrangement shown in FIG. 8 provides a person who has moved into the detection zone and then stopped for a period of time with an audible or visual warning prior to the doors being closed.

The arrangements described are believed to have application in a wide variety of sensing apparatus. There are Applications of proximity sensors where it may not be possible to maintain phase synchronisation between the transmitted radiation signal and the received signal. In these instances a slightly more elaborate arrangement of signal processing may be necessary since synchronism between the transmitted signal and the received signal has been lost and hence phase information about the received signal is no longer known.

A method of achieving a substantial increase in the signal to noise ratio of the amplitude of the received signal without the need for maintaining phase synchronisation will now be described with reference to FIG. 9. The input signal having a frequency F is applied to two multiplying elements 100, 101. In one multiplying element 100 the input signal is multiplied with a carrier reference frequency equal to the expected input signal frequency F. This may be derived from a crystal oscillator running at the same frequency as that of a similar oscillator in the transmitting circuitry. In the second multiplying element 101 the input signal is multiplied by the carrier reference frequency shifted by 90°. The output of each multiplying element is low pass filtered separately in filters 102, 103 and the outputs of these separate low pass filters is applied to two full wave rectifiers 105, 106. The outputs of the full wave rectifiers are then summed together to produce a composite output signal at 108. This composite output signal is in the form of a DC level which is proportional in amplitude to the input signal amplitude provided that the input signal stays very close to the carrier reference frequency. In noise terms the input of this arrangement will not affect the magnitude of the output DC level. The selectivity of this arrangement may be controlled by altering the time constant of the low pass filters. The low pass filters have an averaging effect, the longer the time over which the average is taken. In other words this arrangement gives a substantial increase in the signal to noise ratio of an input signal in applications where the phase of the input signal is unknown but the frequency is known. This may be used with sensor arrangements which are either reflective or line of sight or reception of coded control signal.

Figure 9:
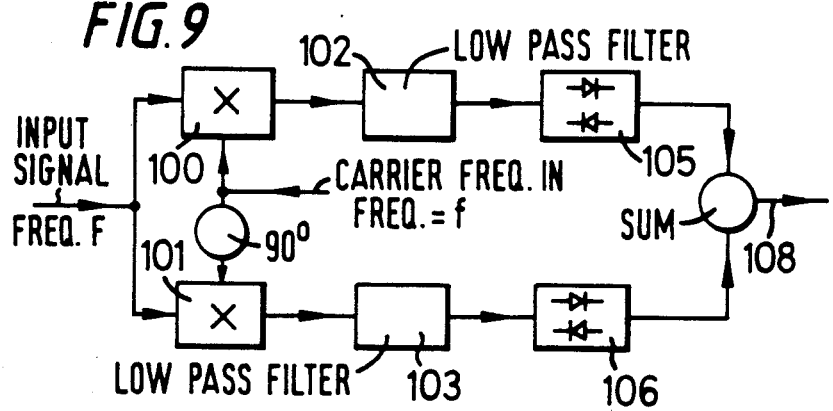

In some circumstances beat effects can cause the production of false or spurious outputs in the FIG. 9 arrangement. This can be obviated by replacing the rectifiers 105, 106 by a single vector summation circuit and vector summing the outputs of the filters 102, 103.

Another application in which a circuit arrangement of the above type is particularly useful is in the processing of ultra-sonic signals. In the case of ultrasonic range finders the frequency of the received signal is known, but the time of occurrence or more correctly arrival at the receiving transducer is unknown. In this application it is necessary to determine the time ar which the signal is received and in this sense is a signal detection problem. The common method of receiving such signals is to pass the received signal which is in the form of a carrier burst to a full wave rectifier and to low pass filter the output of the full wave rectifier to produce an envelope signal. Suitable means are provided to time from the point of transmission to the point to reception of an envelope signal. This time delay is directly proportional to the round trip distance which the sound wave has travelled. The problem with conventional full wave rectifier arrangements is that any inband signal or any transient signal containing inband frequencies will excite the receiver transducer giving an output which the full wave rectifier then demodulates and a low pass filter follows the envelope. In industrial environments this can cause serious false firing problems, caused by for example the dropping of a spanner, jangling of keys, coins, squealing of car or lorry brakes. Any of these may produce inband signals which will be detected equally as well as the required input signal. By using the filter arrangement described many of these problems can be eliminated. However the improvement in signal to noise ratio is limited, since there is a practical limit to the low pass filter time constant in this application. The low pass filter has the effect of spreading the pulse and results in a consequent loss in distance resolution. A further substantial improvement to the reliability of ultrasonic arrangements can be made with another modification to the circuit described above.

Figure 10:
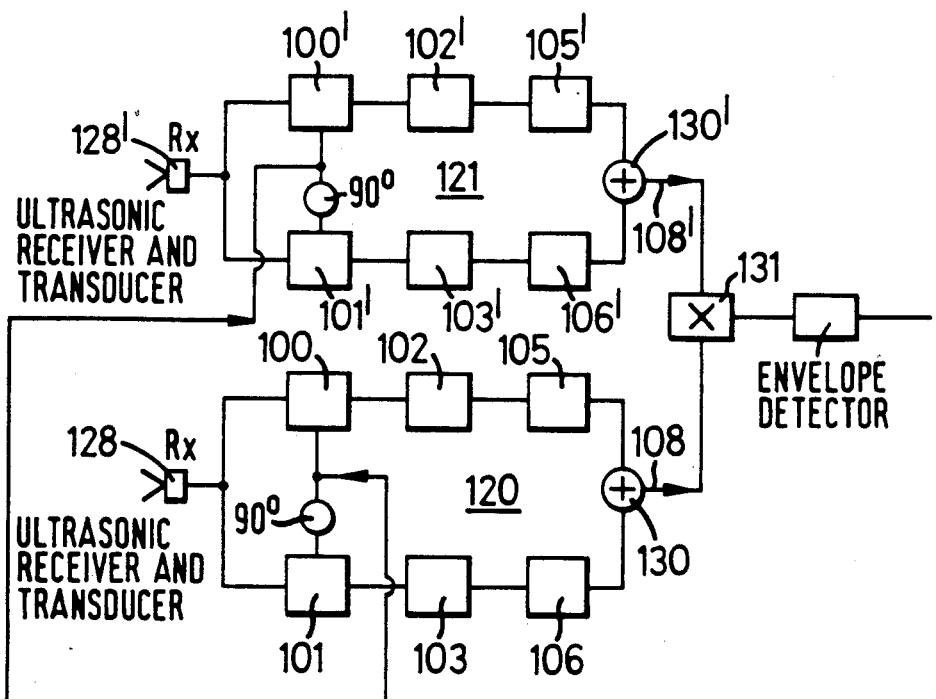

FIG. 10 shows an arrangement with this further modification. In this arrangement two separate channels 120, 121 are used. The transmitting circuitry includes an oscillator 122 running at frequency F1 coupled via a switch 124 to one ultrasonic transducer 125 designed to run at this frequency F1. The output of the oscillator 122 is also fed to one channel 120 of the signal demodulator, this channel being similar to that described with reference to FIG. 9. The input signal to the signal demodulator is derived from an ultrasonic transducer receiver 128 which is designed to receive radiation at the frequency F1. The second channel is identical to that of the first (corresponding elements are shown by primed reference numerals) but the oscillator frequency is running at some other frequency F2 and driving an ultrasonic transmitter designed to transmit ultrasonic radiation at the frequency F2. The corresponding receiver channel is fed with the oscillator signal F2. The receiver connected to this signal demodulator is designed to receive ultrasonic energy at frequency F2.

The operation is as follows. A transmit command signal closes switches 124, 124¹ simultaneously to connect the transmitting ultrasonic transducers to their respective channels simultaneously. The signal is transmitted for a predetermined length of time. The signal leaves the transmitting transducers and is reflected from any objects in front of the arrangements. Thus each ultrasonic receiving transducer 128, 128¹ will receive the composite transmitted signal comprising of frequency F1 and frequency F2 added together. Provided the two ultrasonic receivers are physically close together the reception of this composite signal will be simultaneous. Each ultrasonic receiver will only respond to its own frequency. Thus in FIG. 10 the receiver transducer 128¹ will respond only to frequency F2 within the composite received signal and similarly the ultrasonic receiver transducer 128 will respond only to the frequency F1 component of the composite received signal. The signal is demodulated as described with reference to FIG. 9 and appears at the outputs of each of the summing elements 130, 130¹. Each summing element will output a DC level corresponding to the amplitude of its respective frequency component in its respective channel. The two demodulated signals are now passed to a further multiplying element 131 where they are multiplied together to give a resultant signal, which is then fed to an envelope detector. By measuring the time from beginning of transmission to when reception occurs a round trip distance for the radiation may be calculated. This distance is proportional to the distance of the object from the transmitter and receiver arrangement. The effect of the final multiplying element 131 is to produce an output signal only when both received signals within the bandwidth F1 and F2 are received simultaneously. Thus the envelope detector will only receive an envelope if both channels receive a signal simultaneously. In the case of extraneous noise from an industrial environment a misfire can only occur if a noise signal is generated which has components simultaneously within the bandwidth of demodulator arrangement running at F1 and also within the bandwidth of the demodulator arrangement running at F2. The probability of this is extremely small and can be made even smaller by including further independent ultrasonic channels.

I claim:

1. A proximity detector comprising a sensor unit arranged to sense reflected energy received from a predetermined volume or zone and to generate a signal representative of the received energy and circuit means for processing said received signals to control operation of apparatus such a automatic doors, said circuit means including means for generating a signal representative of the signal received by said sensor unit, means sensing when the received signal changes, and means for controlling operation of the apparatus in response to a sensed change, characterised in that the sensing means includes a comparator for comparing the representative signal with a voltage signal, said comparator being arranged to assume a given state when the representative signal varies from said voltage signal, and circuit means associated with said comparator for causing said voltage signal to follow or track changes in said representative signal in a predefined way, and the arrangement being such that when the representative signal changes in a first direction the voltage signal is arranged to follow the change relatively slowly and when the representative signal changes in the opposite direction the voltage signal is arranged to follow the change relatively rapidly.

2. A proximity detectors as claimed in claim 1 wherein the circuit means includes means for providing said voltage signal, said providing means including a capacitor and associated charging and discharging circuitry for charging or discharging the capacitor according to the direction of the change of the representative signal.

3. A proximity detector as claimed in claim 2 wherein the charging and discharging circuits have time constants selected to provide appropriate time delays in the operational sequence of the apparatus.

4. A proximity detector as claimed in claim 2 wherein the control circuit means include switching means for inhibiting operation of the charging or discharging circuitry for a given period of time after the sensing of a change in the representative signal.

5. A proximity detector as claimed in any one of claims 2 to 4 further including means for varying the charging or discharging rates.

6. A proximity as claimed in claim 5 wherein the variation of charging or discharging rate is carried out according to the difference between the voltage signal and the representative signal.

7. A proximity detector as claimed in any one of claim 1 to 6 including actuating means operatively coupled to said comparator, for providing an actuating signal in response to said representative signal and said voltage signal or a signal derived from said voltage signal, said actuating means providing said actuating signal when the signals are in a given relationship.

8. A proximity detection arrangement of the type adapted for controlling the automatic opening and closing of a door, said proximity detection arrangement comprising:
- a sensor positioned to receive energy reflected from objects disposed in proximity to said door, said sensor providing a first electrical signal having a level responsive to the amplitude of said received energy;
- a tracking circuit arrangement connected to receive said first electrical signal, said tracking circuit arrangement generating a tracking electrical signal having a level which follows changes of a first direction and of a second direction opposite said first direction in the level of said first electrical signal, said tracking circuit causing said tracking electrical signal to follow first direction changes in said first electrical signal level substantially more rapidly than said tracking electrical signal follows second direction changes in said first electrical signal level; and
- a control circuit, operatively coupled to said sensor and to said tracking circuit arrangement, for controlling the opening and closing of said door in response to the difference between said first electrical signal level and said tracking electrical signal level.

9. A proximity detection arrangement as in claim 8 further including means operatively coupled to said tracking circuit arrangement and to said control circuit for inhibiting said tracking electrical signal level from said tracking said first electrical signal level during a time delay after said control circuit controls said door to open.

10. A proximity detection arrangement as in claim 8 wherein said first direction changes are responsive to an object moving into closer proximity to said sensor, said second direction changes are responsive to said object moving away from proximity to said sensor, and said tracking circuit arrangement includes means for rapidly adapting to said first electrical signal level when said sensor ceases to receive energy.

11. A proximity detection arrangement for controlling a door to automatically open and close, said proximity detection arrangement comprising:
- sensor means for being mounted near said door so as to receive energy reflected from a zone in proximity to said door, said sensor means for providing an output signal responsive to said received energy, said output signal having a level;
- tracking means connected to receive said sensor means output signal, said tracking means for providing a further signal having a level which tracks changes in said sensor means output signal level, said tracking means including means for causing said further signal to follow increases in said sensor means output signal level at a first rate and for causing said further signal to follow decreases in said sensor means output signal level at a second rate substantially different from said first rate; and
- control means, operatively coupled to said sensor means and to said tracking means, for automatically opening and closing of said door in response to the difference between said sensor means output signal level and said further signal level.

12. A proximity detection arrangement as in claim 11 further including means operatively coupled to said tracking means and to said control means for inhibiting said further signal level from changing level during a time delay after said control means controls said door to open.

13. A proximity detection arrangement as in claim 11 wherein said tracking means includes means for rapidly adapting said further signal level to said sensor means output signal level when said sensor means ceases to receive energy so as to rapidly close said door when said object is no longer within said zone.

* * * * *